(12) United States Patent
Song et al.

(10) Patent No.: US 11,652,073 B2
(45) Date of Patent: May 16, 2023

(54) LIGHT SOURCE UNIT AND DISPLAY DEVICE INCLUDING THE SAME

(71) Applicant: LG Display Co., Ltd., Seoul (KR)

(72) Inventors: Tae-Joon Song, Paju-si (KR); Kyu-Hwang Lee, Paju-si (KR); Chul-Ho Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/549,844

(22) Filed: Dec. 13, 2021

(65) Prior Publication Data

US 2022/0189896 A1 Jun. 16, 2022

(30) Foreign Application Priority Data

Dec. 15, 2020 (KR) .................... 10-2020-0175042

(51) Int. Cl.
| | |
|---|---|
| *H01L 23/00* | (2006.01) |
| *H01L 33/62* | (2010.01) |
| *H05K 1/03* | (2006.01) |
| *H05K 1/11* | (2006.01) |
| *G02F 1/13357* | (2006.01) |
| *G02F 1/1335* | (2006.01) |

(52) U.S. Cl.
CPC ........ *H01L 24/05* (2013.01); *G02F 1/133603* (2013.01); *G02F 1/133612* (2021.01); *H01L 33/62* (2013.01); *H05K 1/0306* (2013.01); *H05K 1/111* (2013.01); *H01L 2224/05017* (2013.01); *H01L 2224/0518* (2013.01); *H01L 2224/05084* (2013.01); *H01L 2224/05147* (2013.01); *H01L 2224/05166* (2013.01); *H05K 2201/10106* (2013.01)

(58) Field of Classification Search
CPC ... H01L 2224/05166; H01L 2224/0518; H01L 33/14; H01L 27/1214; H01L 27/156; H01L 33/40; H01L 33/642; H05K 2201/10106
See application file for complete search history.

(56) References Cited

U.S. PATENT DOCUMENTS

| | | | |
|---|---|---|---|
| 2004/0014317 A1* | 1/2004 | Sakamoto | ......... H01L 23/49838 438/689 |
| 2008/0191231 A1* | 8/2008 | Park | .................. G02F 1/133603 257/E25.02 |
| 2009/0032942 A1 | 2/2009 | Choi | |

(Continued)

FOREIGN PATENT DOCUMENTS

| | | |
|---|---|---|
| KR | 10-2004-0083192 A | 10/2004 |
| KR | 10-2007-0082998 A | 8/2007 |
| KR | 10-2020-0064399 A | 6/2020 |

OTHER PUBLICATIONS

GWAN_KR1020040083192_machine translation (Year: 2004).*
WON_KR1020200064399_manual translation (Year: 2020).*

*Primary Examiner* — Tracie Y Green
(74) *Attorney, Agent, or Firm* — Seed Ip Law Group LLP

(57) ABSTRACT

A light source unit for a display device includes: a printed circuit board including a soldering pad located on a substrate of glass and including a copper layer, and a first diffusing barrier pattern located on the soldering pad and including a molybdenum alloy; and a light emitting diode mounted on the soldering pad through a solder resist. In one embodiment, the printed circuit board is a glass printed circuit board.

21 Claims, 8 Drawing Sheets

(56) References Cited

U.S. PATENT DOCUMENTS

| | | | |
|---|---|---|---|
| 2011/0260200 A1* | 10/2011 | Chen | H05K 1/0206 |
| | | | 205/159 |
| 2012/0201007 A1* | 8/2012 | Yeh | F21V 29/70 |
| | | | 29/832 |
| 2020/0225517 A1* | 7/2020 | Tydtgat | G02F 1/133504 |
| 2021/0096456 A1* | 4/2021 | Suzuki | G03F 1/48 |
| 2022/0308415 A1* | 9/2022 | Choi | H01L 21/77 |

* cited by examiner

LIGHT SOURCE UNIT AND DISPLAY DEVICE INCLUDING THE SAME

CROSS REFERENCE TO RELATED APPLICATIONS

The present application claims the priority benefit of Korean Patent Application No. 10-2020-0175042 filed in Republic of Korea on Dec. 15, 2020, which is hereby incorporated by reference in its entirety for all purposes as if fully set forth herein.

BACKGROUND

Technical Field

The present disclosure relates to a display device including a light source unit, and more particularly, relates to a display device which can prevent a detachment of a light emitting diode (LED) of a light source unit or a connector.

Description of the Related Art

Recently, with a development of an information technology and a mobile communication technology, a development of a display device to visually display an information has been made. The display device is categorized into a self-luminescent type display device having a light emission property and a non-self-luminescent type display device displaying an image with an external factor.

As an example of a non-self-luminescent display device having no self-luminescent element, a liquid crystal display (LCD) device is used.

The LCD device as the non-self-luminescent display device requires a light source additionally. A backlight unit including a light source at the back of the LCD device is provided and a light irradiates toward the front of the LCD device, and thus a recognizable image is realized.

The backlight unit uses a cold cathode fluorescent lamp (CCFL), an external electrode fluorescent lamp (EEFL), or a light emitting diode (LED) as a light source.

Among these light sources, the LED especially has characteristics of a small size, a lower power consumption and a high reliability and has been used widely.

Depending on an arrangement of the LEDs, the backlight unit is generally categorized into a side light type unit and a direct light type. The side light type backlight unit has a structure that the LEDs are arranged at one side surface or both side surfaces of a light guide plate, and a side light radiated from LED is converted into a plane light through the light guide plate and irradiates a display panel.

The direct light type backlight unit has LEDs arranged below a display panel and emits a light directly to a display panel.

Recently, a research of a large-sized display device has been made actively by consumer's needs, and a direct light type backlight unit is more suitable for a large-sized display device than a side light type backlight unit.

Further, the direct light type backlight unit can improve a uniformity and a brightness of a light emitted to a display panel. The direct light type backlight unit can realize a local dimming driving, and thus a contrast ratio can be improved and a reduction of power consumption can be achieved.

The direct light type backlight unit includes a light source which is configured with a circuit board of a plate shape and a plurality of LEDs mounted on the circuit board and spaced apart from each other at constant intervals. The circuit board where the LEDs are mounted may use, for example, a printed circuit board (PCB), a metal core or metal clad PCB (MCPCB), a metal PCB (MPCB), a flexible PCB (FPCB) or the like.

Because the circuit board is generally formed of a substrate of a synthetic resin or an insulating material, the circuit board has problems of a low thermal conductivity and its own poor flatness.

When a thermal conductivity of the circuit board is low, a heat emitted from the circuit board is relatively low, and a malfunction of the mounted LED or a reduction of lifetime of the mounted LED is caused.

When a flatness of the circuit board is poor, a bad bonding of fine patterns formed on the circuit board is produced.

Because the above problems finally affect a productivity or a reduction of yield of the circuit board, a production cost is increased, and an efficiency of a manufacturing process is reduced.

BRIEF SUMMARY

Accordingly, the present disclosure is directed to a display device that substantially obviates one or more of the problems due to limitations and disadvantages of the related art.

An advantage of the present disclosure is to provide a display device which can include a circuit board having good thermal conductivity.

Another advantage of the present disclosure is to provide a display device which can reduce a production cost and improve a process efficiency.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a light source unit for a display device includes: a printed circuit board (PCB) including a soldering pad located on a substrate of and including a copper (Cu) layer, and a first diffusing barrier pattern located on the soldering pad and including a molybdenum (Mo) alloy; and a light emitting diode (LED) mounted on the soldering pad through a solder resist. In one embodiment, the printed circuit board is a glass printed circuit board and in one embodiment the substrate on which the soldering pad is located is a glass substrate that includes a copper. In another embodiment, a display device includes: a light source unit including a glass printed circuit board (PCB) and a plurality of light emitting diodes (LEDs) mounted on the glass PCB; an optical unit located on the light source unit; and a display panel located on the optical unit, wherein the glass PCB includes a soldering pad, and a first diffusing barrier pattern, and wherein the LED is mounted on the soldering pad through a solder resist.

It is to be understood that both the foregoing general description and the following detailed description are examples and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this specification, illustrate embodiments of the disclosure and together with the description serve to explain the principles of the disclosure. In the drawings.

DETAILED DESCRIPTION

Reference will now be made in detail to embodiments, examples of which are illustrated in the accompanying drawings. The same reference numbers may be used throughout the drawings to refer to the same or like parts.

Figure 1:
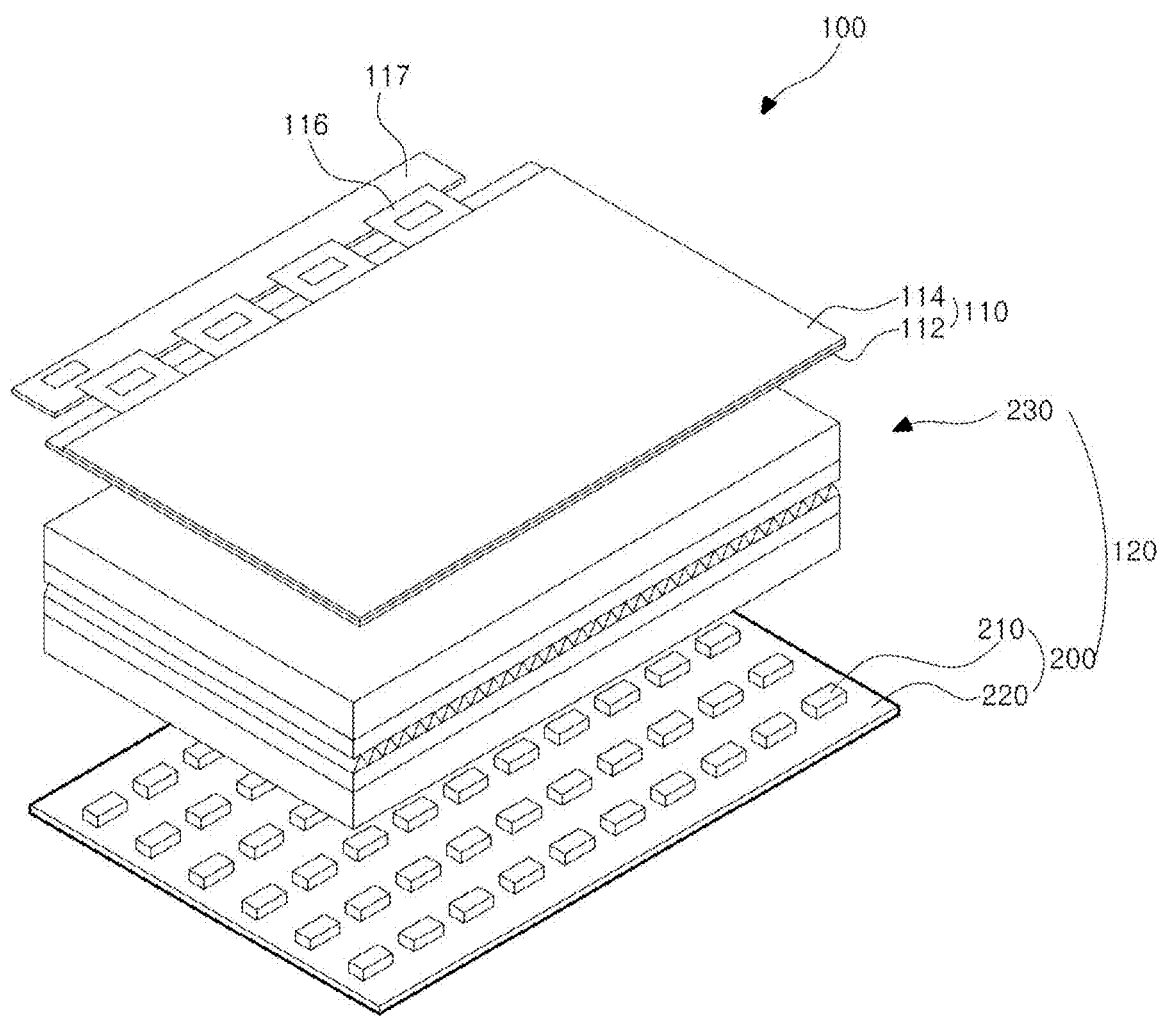
FIG. 1 is an exploded perspective view illustrating a display device according to an embodiment of the present disclosure.

FIG. 1 is an exploded perspective view illustrating a display device according to an embodiment of the present disclosure.

Referring to FIG. 1, the display device 100 may include a display panel 110, and a backlight unit 120 supplying a light to the display panel 110. The backlight unit 120 may be a backlight structure including backlight circuits, and may be referred to as the backlight structure 120.

For the purpose of explanations, directions are defined in the drawings as follows: provided that a display surface of the display panel 110 faces forward, the backlight unit 120 is located at a rear of the display panel 110.

These components are explained in more detail.

The display panel 110 may use one of a liquid crystal display (LCD) panel, a plasma display panel (PDP), a field emission display (FED) panel, an electroluminescent display (ELD) panel and an organic light emitting diode (LED) display panel.

For the purpose of explanations, an LCD device, which transmits a light emitted from the backlight unit 120 to the display panel 110 by controlling an electric field applied to a liquid crystal layer of the display panel 110 and changing an alignment of liquid crystal molecules and thus displays an image, is explained by way of example.

The display panel 110 is a part which plays a key role of an image display, and may include a first substrate 112 and a second substrate 114 which are attached to each other with a liquid crystal layer interposed therebetween.

Provided that the display panel is an active matrix type panel, even though not shown in detail in the drawings, a plurality of pixels may be defined by (e.g., disposed at) crossings of a plurality of gate lines and a plurality of data lines on an inner surface of the first substrate 112 which is referred to as a lower substrate or an array substrate, and a thin film transistor may be located at each crossing portion and be connected to a pixel electrode formed in each pixel.

On an inner surface of the second substrate 114 which is referred to as an upper substrate or a color filter substrate, red (R), green (G) and blue (B) color filters corresponding to respective pixels and a black matrix surrounding the color filters and blocking non-display elements such as the gate lines, the data lines and the thin film transistors may be formed. A transparent common electrode may be provided to cover the color filters and the black matrix.

Even though not shown clearly in the drawings, an upper alignment layer and a lower alignment layer may be interposed at the boundaries between the two substrates 112 and 114 and the liquid crystal layer of the display panel 110, and to prevent a leakage of liquid crystal molecules filled between the upper and lower alignment layers, a seal pattern may be formed along edges of the two substrates 112 and 114.

Upper and lower polarization plates (not shown) may be respectively attached to the first and second substrates 112 and 114.

A printed circuit board 117 may be connected to an edge of the display panel 110 through a connection member 116 such as a flexible circuit board or a tape carrier package (TCP).

When a thin film transistor selected by gate line by an on/off signal of a thin film transistor transferred to a gate line is turned on, an image signal of a data line is transferred to a corresponding pixel electrode, and by an electric field produced between the pixel electrode and the common electrode, an alignment direction of liquid crystal molecules change and a difference of transmittance is made.

In the display device 100 according to an embodiment of the present disclosure, in order that the difference of transmittance made by the display panel 110 is manifested to the outside, a backlight unit 120 supplying a light at a rear of the display panel 110 is provided.

A plane light of a high brightness realized by the backlight unit 120 is supplied to the display panel 110, and thus the display panel 110 displays an image.

The backlight unit may include a light source unit 200 and an optical unit 230 located on the light source unit 200. The light source unit 200 may be a light source structure, and may be referred to as the light source structure 200. The optical unit 230 may be an optical structure, and may be referred to as the optical structure 230.

The light source unit 200 may include a glass PCB 220 of a plate shape, and a plurality of light sources 210 mounted at predetermined or selected intervals on the glass PCB 220. In another embodiment, the PCB 220 is made of any acceptable material that does not include glass. In one embodiment, the glass for the PCB can be a type of fiberglass. Thus, a fiberglass PCB is considered a glass PCB within the context of this application, similarly, a fiberglass based substrate is considered a glass substrate. In one embodiment, the glass for the PCB is a fully transparent glass and glass PCB is fully transparent, expect where the copper lines are present. Thus, the glass PCB and the glass substrate can be comprised of a transparent glass through which light can pass. Transparent glass PCB's are known in the art and any of the commercially available transparent glass PCB's are acceptable for this embodiment. Other types of glass based substrates besides fiberglass and transparent glass may also be used as the glass substrate. Each light source 210 may be formed of a light emitting diode (LED). The LED as the light source 210 may use a mini LED having a size of hundreds of micrometers or a micro (μ) LED having a size of tens of micrometers.

In order to improve a light emission efficiency and a brightness of the LED 210 as the light source according to an embodiment of the present disclosure may use a blue LED, the LED 210 may use a blue LED which includes a multi-quantum well layer emitting a blue light having good light emission efficiency and brightness.

The optical unit 230 located on the light source unit 200 may serve to diffuse and guide an incident light coming from the light source unit 200 to a whole of the backlight unit 120, and may serve to supply a white plane light processed uniformly to the display panel 110.

Accordingly, in the display device 100 according to an embodiment of the present disclosure, a white plane light processed uniformly may be provided to the display panel 110.

Figure 2:
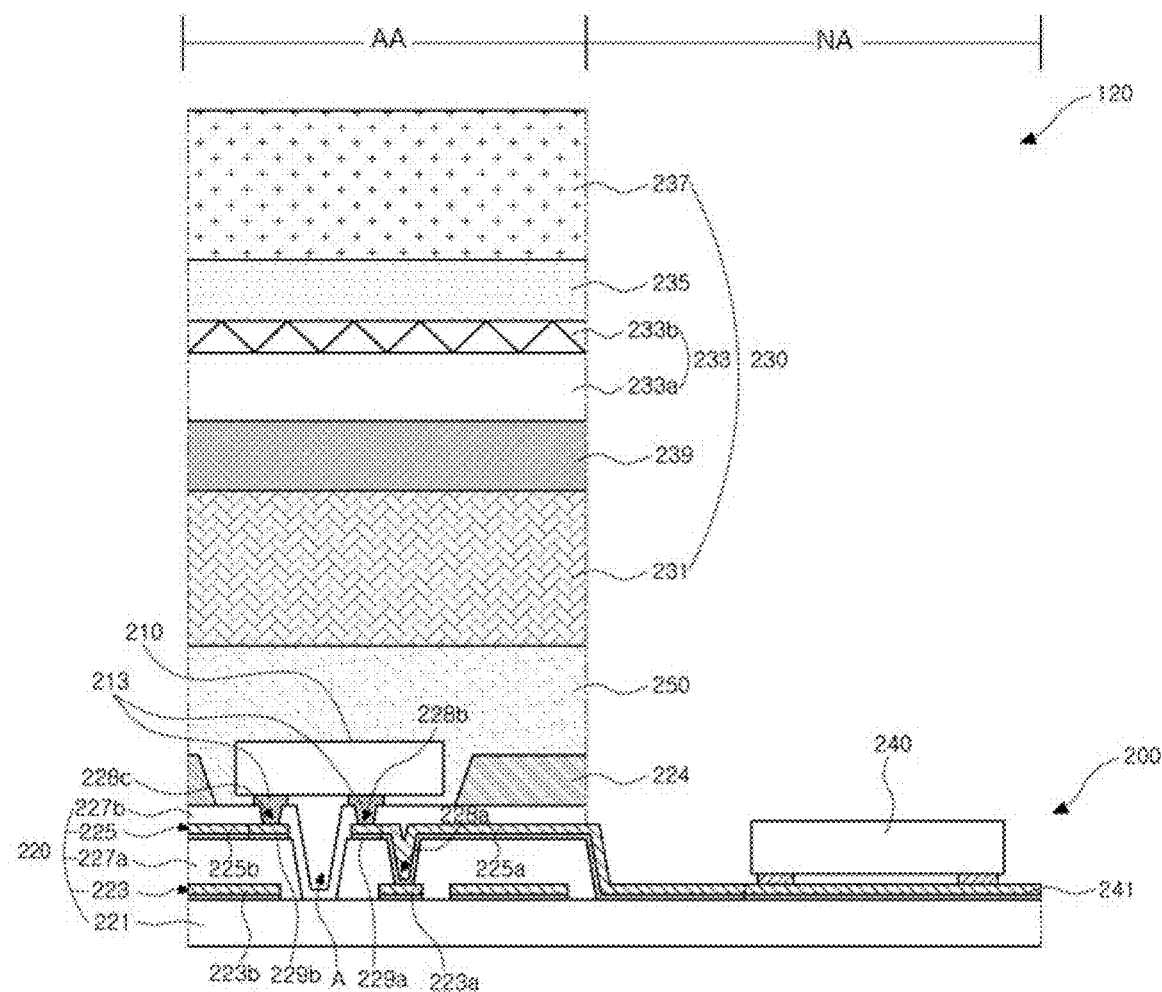
FIG. 2 is a cross-sectional view schematically illustrating a light source unit and an optical unit according to an embodiment of the present disclosure.

FIG. 2 is a cross-sectional view schematically illustrating a light source unit and an optical unit according to an embodiment of the present disclosure.

Referring to FIG. 2, the optical unit 230 may be located on the light source unit 200 which is located in the display region AA. The plurality of LEDs 210 of the light source unit 200 may be mounted on the glass PCB 220 of a plate shape using a surface mount technology (SMT).

The glass PCB 220 may include a plurality of line layers 223 and 225 and a plurality of insulating layers 227a and 227b on a substrate 221.

In more detail, the glass PCB 220 may include the substrate 221 formed of glass. The substrate 221 may serve to mount and support the line layers 223 and 225 and the insulating layers 227a and 227b located on the substrate 221.

On the substrate 221, a first line layer 223 including first and second line patterns 223a and 223b which are formed by patterning a conductive material may be formed. The first line layer 223 may be configured with a double-layered structure of a copper (Cu) layer being stacked on a molybdenum-titanium (MoTi) alloy layer.

In this regard, because the plurality of LEDs 210 are mounted on the glass PCB 220, signal processing speeds of the line patterns 223a, 223b, 225a and 225b formed at the glass PCB 220 benefit from being fast. Thus, the line patterns 223a, 223b, 225a and 225b are formed using a copper (Cu) layer having excellent specific resistance and electron mobility, but copper (Cu) has poor adhesion with the substrate 221 and has problems of peeling off or floating off.

Thus, in one embodiment, a structure of the line patterns 223a, 223b, 225a and 225b, which is configured with double layers of the copper (Cu) layer and a barrier layer that is additionally included below the copper (Cu) layer in order to improve an adhesion between the glass substrate and the line patterns 223a, 223b, 225a and 225b. The barrier layer may be molybdenum (Mo), titanium (Ti), molybdenum (Mo) alloy, or titanium (Ti) alloy.

The glass PCB 220 according to an embodiment of the present disclosure having a structure configured with double layers of a copper (Cu) layer and a barrier layer in which the copper (Cu) layer is stacked on a molybdenum-titanium (MoTi) alloy layer is explained by way of example.

A first insulating layer 227a may be located on the first line layer 223. The first insulating layer 227a may include a first contact hole 228a exposing the first line pattern 223a.

The second line layer 225 including the third and fourth line patterns 225a and 225b may be located on the first insulating layer 227a including the first contact hole 228a. The second line layer 225 may be configured with double layers of a copper (Cu) layer and a barrier layer in which the copper (Cu) layer is stacked on a molybdenum-titanium (MoTi) alloy layer.

The third line pattern 225a may contact the first line pattern 223a exposed through the first contact hole 228a.

The second insulating layer 227b may be located on the second line layer 225. The second insulating layer 227b may include second and third contact holes 228b and 228c respectively exposing the third and fourth line patterns 225a and 225b. Portions of the third and fourth line patterns 225a and 225b exposed through the second and third contact holes 228b and 228c may be first and second soldering pads 229a and 229b, respectively.

The first and second insulating layers 227a and 227b may be formed of a material having an excellent electric insulation. The first and second insulating layers 227a and 227b may be formed by depositing an oxide or a nitride or by depositing or spin-coating a resin such as polyimide.

The first and second soldering pads 229a and 229b exposed through the second and third contact holes 228b and 228c of the second insulating layer 227b may be respectively soldered to cathode and anode (not shown) of the LED 210 through a solder resist formed of an organic solder preserve (OSP), and the LED 210 may be surface-mounted on the glass PCB 220.

A cover layer 224 may be formed around the LED 210 electrically connected to the first and second soldering pads 229a and 229b below the second insulating layer 227b. The cover layer 224 may be preferably formed of a white photo solder resist (PSR) ink having a high reflective efficiency to function as a brightness reflector of the LED 210.

Thus, the cover layer 224 may reflect a light emitted from the LED 210 forward and improve a brightness.

The glass PCB 220 may have no first and second insulating layers 227a and 227b below the LED 210 so that the glass PCB 220 may include a heat dissipation groove A having an air. Due to the heat dissipation groove A, a heat of high temperature produced from the LED 210 may easily dissipate to the outside.

Further, it is preferable that no line patterns 223a, 223b, 225a and 225b are located in the heat dissipation groove A. This is because: due to an overflow of the line patterns 223a, 223b, 225a and 225b in the heat dissipation groove A caused by thermal expansions of the line patterns 223a, 223b, 225a and 225b in the sealed heat dissipation groove A by a soldering temperature in a process of mounting the LED 210 on the glass PCB 220, a short-circuit defect of the line patterns 223a, 223b, 225a and 225b may be produced.

The third line pattern 225a may extend over the non-display region NA of the glass PCB 220 and may form an external contact pad 241 to be connected to an external driving circuit (not shown). On the external contact pad 241, a connector 240 may be mounted through a solder resist 213.

The connector 240 mounted on the glass PCB 220 may be connected to an external driving circuit (not shown) such as an LED driving circuit through a FPC or a FFC (flexible flat cable) and may supply a power, which is from the LED driving circuit, to each LED 210 through the line layers 223 and 225.

In the light source unit 200 according to an embodiment of the present disclosure, the line patterns 223a, 223b, 225a and 225b included in the glass PCB 220 may be formed to be divided into the first and second line layers 223 and 225. Thus, a voltage drop phenomenon, which may be caused by a copper (Cu) layer formed only at a very thin thickness that is because the substrate 221 of the glass PCB 220 is formed of a glass, may be prevented.

In other words, on the prior art circuit board using a substrate formed of a synthetic resin or an insulating material, a copper (Cu) layer of a line layer can be formed with an electroless plating method, and thus the copper (Cu) layer can have a thickness of about 5 um to about 7 um. However, on the glass PCB 220 of an embodiment of the present disclosure formed of a glass, a copper (Cu) layer of the line layers 223 and 225 may be formed only with a sputtering method and may have a thickness of about 1 um at most.

Thus, the copper (Cu) layer formed on the glass PCB 220 may have excellent specific resistance and electron mobility, but because the copper (Cu) layer may be formed at a very thin thickness, a voltage drop phenomenon may happen. In the display device 100 of an embodiment of the present disclosure, the plurality of line layers 223 and 225 respectively including the copper (Cu) layers may be formed, and thus the above problem may be resolved.

A resin layer 250 may be located on the glass PCB 220 to cover the glass PCB 220. The resin layer 250 may be coated on the glass PCB 220 at a thickness which is greater than that of the light source 200, and may cover all the LEDs 210 mounted on the glass PCB 220.

The resin layer 250 may serve to fix and protect the LEDs 210, and serve to support the optical unit 230 located on the light source unit 200.

Accordingly, an optical gap or an air gap may be defined between (e.g., may be present between) the light source unit 200 and the optical unit 230.

The optical gap or the air gap may be a region (or a space) in which lights emitted from two or three neighboring LEDs 210 overlap each other or are mixed with each other. In case that the optical gap or the air gap is not obtained, a dark portion in which lights do not overlap each other or are not mixed with each other may be produced between the neighboring LEDs 210.

The optical unit 230, which is supported by the resin layer 250 and is located over and is spaced apart from the light source unit 200 at a predetermined or selected interval, may include a diffusion plate 231, a fluorescent sheet 239, a light condensing portion 233, a light diffusing portion 235, and a complex optical portion 237 which are sequentially located.

The diffusion plate 231 may serve to diffuse a light emitted from the LEDs 210 of the light source unit 200 and to supply a uniform plane light to the display panel 110.

A reflective pattern sheet (not shown) may be located below the diffusion plate 231. The reflective pattern sheet may include a plurality of reflective patterns which are located respectively corresponding to the plurality of LEDs 210.

The reflective pattern may serve to reflect a part of a light emitted upward from the corresponding LED 210 therebelow and to distribute laterally, and the other part of the light may transmit through the reflective pattern and travel upward. Thus, most of the emitted light going upward and entering the display panel 110 can be prevented.

Accordingly, a hot spot being caused by a light entering vertically in an upward direction can be prevented.

The fluorescent sheet 239 may be located on the diffusion plate 231. The fluorescent sheet 239 may include at least one fluorescent substance which absorbs a light of a first color produced by the LED 210 and produces a light of at least one color which is different from the first color.

In case of using the fluorescent sheet 239, the light of the first color produced by the LED 210 and the light of the color produced by the fluorescent sheet 239 may be mixed, and a light of a white may be finally produced and supplied to the display panel 110.

In this regard, in order to improve a light emission efficiency and a brightness of the LED 210 according to an embodiment of the present disclosure, the LED 210 may use a blue LED which includes a multi-quantum well layer emitting a blue light having good light emission efficiency and brightness. Thus, in case that a blue light as a light of a first color from the LED 210 is produced, the fluorescent sheet 239 may absorb a part of the blue light to produce a yellow light as a light of a second color.

The LEDs 210 may respectively emit red (R), green (G) and blue (B) color lights, and by simultaneously turning on the LEDs 210 respectively emitting the red (R), green (G) and blue (B) color lights, a white light by a color mixture may be obtained.

Alternatively, the LED 210 may use a white LED which includes a blue LED chip and a yttrium aluminum garnet doped with a cerium (YAG:Ce), i.e., a yellow fluorescent substance and directly emits a white light. In this case, the fluorescent sheet 239 may be removed.

The light condensing portion 233 may include a supporting layer 233a, and a lens layer 233b which is located on the supporting layer 233a and condenses a light.

The lens layer 233b may be formed of a transparent acryl-based resin. The lens layer 233b may include a plurality of prisms which each have a strip shape along a length direction of the optical unit 230, are arranged adjacently, form a configuration of mountains and valleys repeating, and protrude from the supporting layer 233a.

The light diffusing portion 235 may be located on the light condensing portion 233. The light diffusing portion 235 may diffuse a light output from the light condensing portion 233 to uniformly distribute a light over a large area.

The light diffusing portion 235 may include a diffusing layer. The diffusing layer may be configured to include light diffusing ingredients such as beads, or be configured with fine patterns formed on a bottom surface of the diffusing layer without beads.

Accordingly, the diffusing layer may serve to diffuse a light by refracting and scattering an incidence light, and serve to convert a non-uniform light passing through the light condensing portion 233 into a uniform light and output the uniform light.

The complex optical portion 237 may be configured with at least two light condensing portions being coupled to each other in an integrated form, and prisms of the at least two condensing portions may be arranged to cross each other in length direction. Alternatively, the complex optical portion 237 may be configured with prisms of a polygonal shape in cross-section different than a triangular shape in cross-section, micro lens patterns, lenticular lenses, embossing patterns, or combination thereof.

Further, even though not shown in the drawings, the optical unit 230 may include a dichroic layer and a cover conversion layer. The dichroic layer and the cover conversion layer may serve to process a light emitted from the LED 210 of the light source unit 200 into a white light having an improved color purity.

The light source unit 230 may be attached to a bottom surface of the display panel 110 through a lamination process using a transparent bonding member (not shown). The transparent bonding member may be an optically clear adhesive (OCA), an optically clear resin (OCR), a porous OCA, or a porous OCR.

In the display device 100 according to an embodiment of the present disclosure, it is characterized in that the LEDs 210 of the light source unit 200 are mounted on the glass PCB 220.

Thus, in the display device 100 according to an embodiment of the present disclosure, because the substrate 221 of the glass PCB 220 of the light source unit 200 may be formed of glass, a thermal conductivity can be improved and a flatness can be very improved, compared with the prior art circuit board using a substrate formed of a synthetic resin or an insulating material.

Accordingly, a heat of high temperature produced from the LED 210 can rapidly dissipate to the outside, and a malfunction of the LED 210 or a reduction of lifetime of the LED 210 can be prevented. Further, a bad bonding of the fine patterns 223a, 223b, 225a and 225b formed on the glass PCB 220 can be prevented.

Finally, a production cost of the glass PCB 220 can be reduced, and an efficiency of a manufacturing process of the glass PCB 220 can be improved.

Particularly, in the display device 100 according to an embodiment of the present disclosure, besides the above advantages, a detachment of the LED 210 and the connector 240 mounted on the glass PCB 220 of the light source unit 200 and a problem caused by the detachment can be prevented.

First Embodiment

Figure 3:
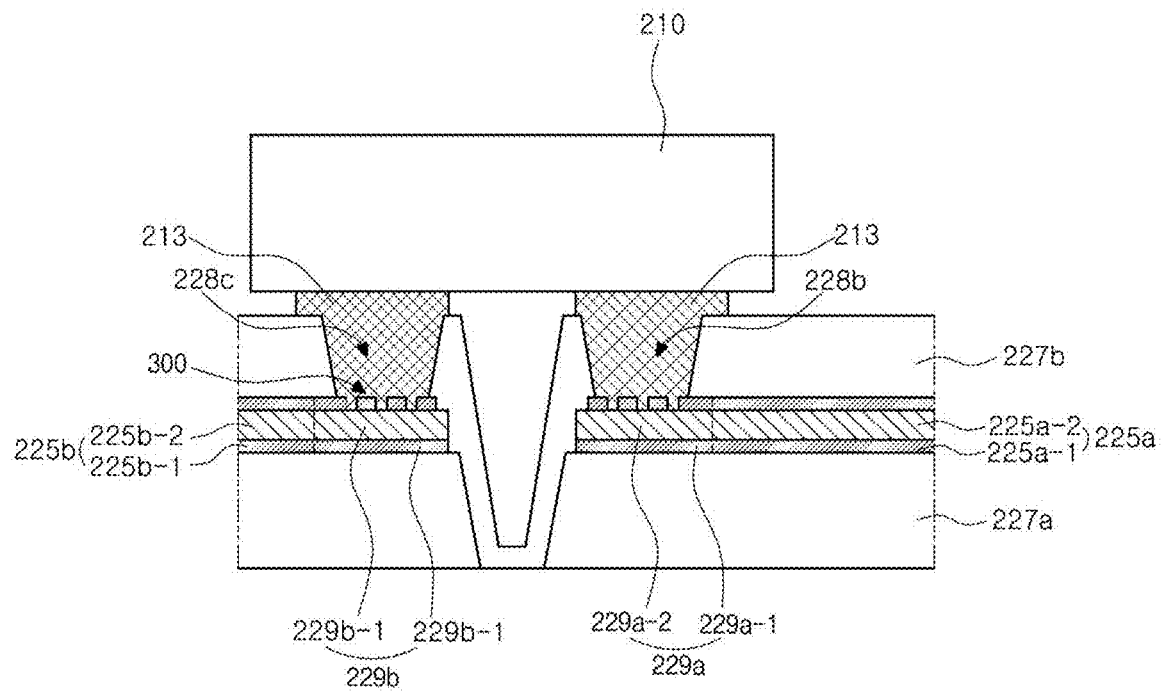
FIG. 3 is a cross-sectional view enlarging a part of a light source unit according to a first embodiment of the present disclosure.
Figure 4:
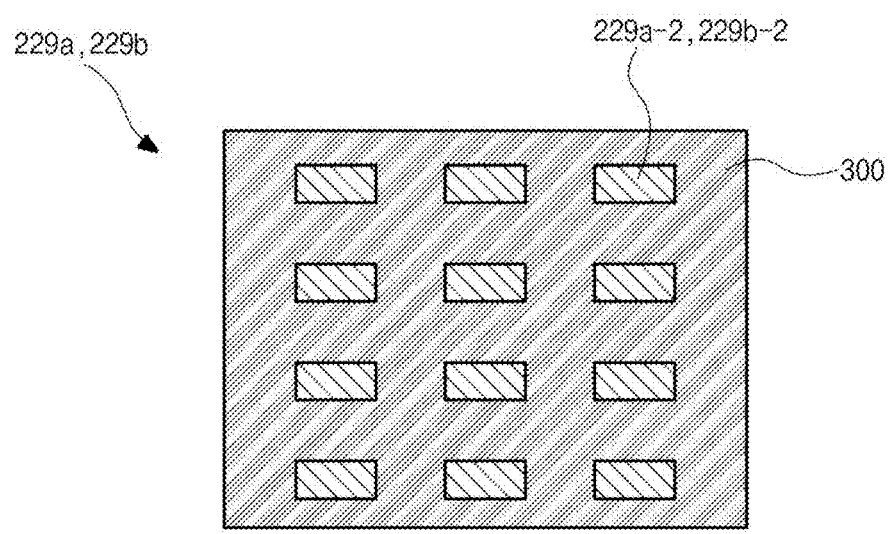
FIG. 4 is a plan view schematically illustrating a soldering pad according to a first embodiment of the present disclosure.
Figure 5A:
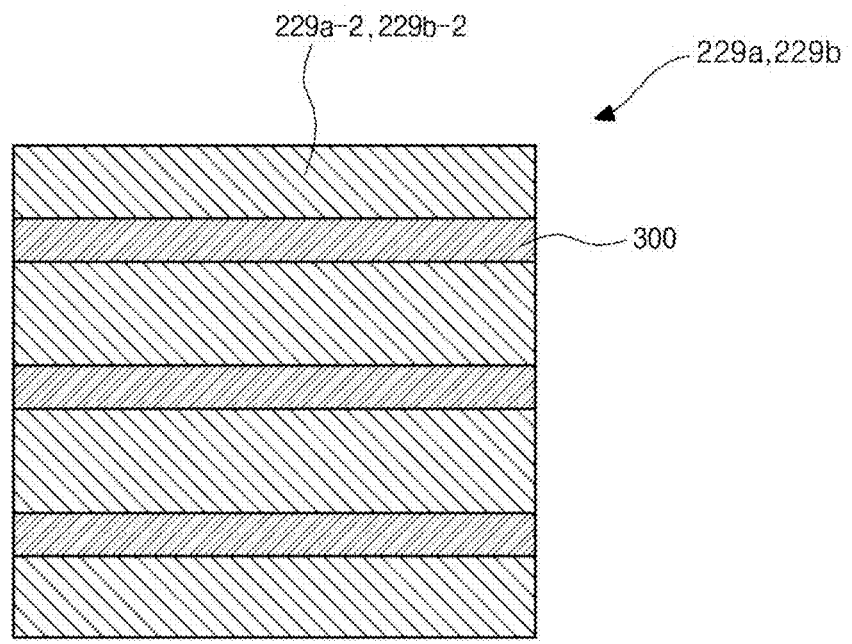
FIGS. 5A and 5B are plan views schematically illustrating another soldering pads according to a first embodiment of the present disclosure
Figure 5B:
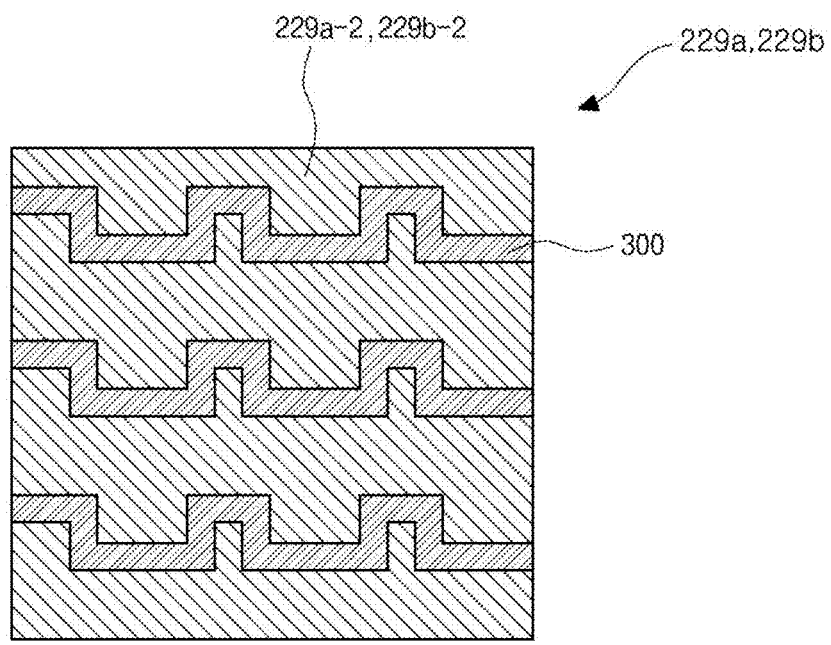

FIG. 3 is a cross-sectional view enlarging a part of a light source unit according to a first embodiment of the present disclosure, and FIGS. 4, 5A and 5B are plan views schematically illustrating soldering pads according to a first embodiment of the present disclosure.

Referring to FIG. 3, in the glass PCB (220 of FIG. 2), the third and fourth line patterns 225a and 225b may be located on the first insulating layer 227a on the substrate (221 of FIG. 2). The second insulating layer 227b may be located on the third and fourth line patterns 225a and 225b. The second insulating layer 227b may include the second and third contact holes 228b and 228c respectively exposing the first and second soldering pads 229a and 229b, and the third and fourth line patterns 225a and 225b may respectively include the first and second soldering pads 229a and 229b located at ends of the third and fourth line patterns 225a and 225b facing each other.

The first and second soldering pads 229a and 229b exposed through the second and third contact holes 228b and 228c and the LED 210 may be soldered to each other using the solder resist 213, and the LED 210 may be mounted on the glass PCB (220 of FIG. 2).

The solder resist 213 may be formed of a tin (Sn) based material. More particularly, the solder resist 213 may include tin (Sn) as a main component and further silver (Ag) and/or copper (Cu).

In the display device 100 according to the first embodiment of the present disclosure, the third and fourth line patterns 225a and 225b may each have double-layered structures of molybdenum-titanium (MoTi) alloy layers 225a-1 and 225b-1 and copper (Cu) layers 225a-2 and 225b-2 being stacked. The first and second soldering pads 229a and 229b located at the ends of the third and fourth line patterns 225a and 225b may each have triple-layered structures of molybdenum-titanium (MoTi) alloy layers 229a-1 and 229b-1 and copper (Cu) layers 229a-2 and 229b-2 and further diffusing barrier patterns 300 located thereon.

In other words, referring to FIG. 4, the first and second soldering pads 229a and 229b may further include the respective diffusing barrier patterns 300 which are located on the copper (Cu) layers 229a-2 and 229b-2 and expose parts of the copper (Cu) layers 229a-2 and 229b-2.

The diffusing barrier pattern 300 may be configured in a lattice shape and be formed of molybdenum-titanium (MoTi) alloy, but not limited thereto.

Accordingly, in the display device (100 of FIG. 1) according to the first embodiment of the present disclosure, a detachment of the LED 210 mounted on the glass PCB can be prevented.

In more detail, the soldering pads 229a and 229b include the copper (Cu) layers 229a-2 and 229b-2, and the solder resist 213 may be formed of a tin (Sn) based material. In this case, when a soldering is conducted on the soldering pads 229a and 229b using the solder resist 213, an intermetallic compound (IMC) which has a ε-phase Cu3Sn and a η-phase Cu6Sn5 is formed at interfaces between the copper (Cu) layers 229a-2 and 229b-2 and the solder resists 213.

Voids are formed in the IMC. The voids are Kirkendall voids formed by a diffusion speed difference of atoms, and the Kirkendall voids are grown in a form of a mutual connection.

Thus, at the soldering regions as the bonding portions, where the Kirkendall voids are formed, between the copper (Cu) layers 229a-2 and 229b-2 and the solder resists 213, a reliability of a mechanical impact property or the like are badly influenced.

Accordingly, the LED 210 is easily detached from the glass PCB even by a very small external force.

Therefore, it is preferable that the IMC being formed between the soldering pads 229a and 229b and the solder resists 213 is prevented. In the light source unit (200 of FIG. 2) of the first embodiment of the present disclosure, the diffusion barrier patterns 300 formed of the molybdenum-titanium (MoTi) alloy may be formed on the copper layers 229a-2 and 229b-2 of the soldering pads 229a and 229b of the glass PCB (220 of FIG. 2).

The molybdenum-titanium (MoTi) alloy may reform a bonding surface with an electrode formed of copper (Cu). Particularly, the molybdenum-titanium (MoTi) alloy may suppress an occurrence of voids at a high temperature and improve a bonding strength.

In other words, the diffusing barrier pattern 300 made of the molybdenum-titanium (MoTi) alloy may serve to suppress a diffusion of copper (Cu) from the copper (Cu) layers 229a-2 and 229b-2 to the solder resists 213. Thus, the diffusing barrier pattern 300 made of the molybdenum-titanium (MoTi) alloy may suppress a mutual diffusion between the copper (Cu) layers 229a-2 and 229b-2 and the solder resists 213 so that a growth of the IMC of Cu3Sn or Cu6Sn5 may be suppressed. Thus, an occurrence of the Kirkendall voids can be reduced.

As a result, because an occurrence of the Kirkendall voids is reduced, the soldering pads 229a and 229b and the solder resists 213 can have an excellent electrical contact property and a high reliability.

Accordingly, in the display device (100 of FIG. 1) according to the first embodiment of the present disclosure, even though the soldering pads 229a and 229b include the copper (Cu) layers 229a-2 and 229b-2, a detachment of the LED 210 mounted on the glass PCB (220 of FIG. 2) can be prevented.

In the first embodiment of the present disclosure, it is shown by way of example that molybdenum-titanium (MoTi) alloy layers extending from the diffusing barrier patterns 300 are located on the copper (Cu) layers 225a-2 and 225b-2 of the third and fourth line patterns 225a and 225b. However, the molybdenum-titanium (MoTi) alloy layers located on the copper (Cu) layers 225a-2 and 225b-2 of the third and fourth line patterns 225a and 225b may be removed in a process of forming the diffusing barrier patterns 300 of the first and second soldering pads 229*a* and 229*b*.

In other words, as shown in FIG. 4, the first and second soldering pads 229*a* and 229*b* may further include the diffusing barrier patterns 300 which are located on the copper (Cu) layers 229*a*-2 and 229*b*-2 and expose parts of the copper (Cu) layers 229*a*-2 and 229*b*-2.

The diffusing barrier pattern 300 may have a lattice shape and be formed of the molybdenum-titanium (MoTi) alloy, but not limited thereto.

Besides the lattice shape shown in FIG. 4, the diffusing barrier pattern 300 at the glass PCB (220 of FIG. 2) of the light source unit (200 of FIG. 2) may be formed with a plurality of bar-shaped portions spaced apart from each other at predetermined or selected intervals, as shown in FIG. 5A, or with a plurality of bar-shaped portions spaced apart from each other at predetermined or selected intervals and each having a plurality of bent parts, as shown in FIG. 5B. It should be understood that "bent" includes the meaning of wavy, S-shaped, curved, or other similar descriptors that may be used to refer to the shape of the diffusing barrier pattern 300 illustrated in FIG. 5B. Relative to the page, the diffusing barrier pattern 300 includes horizontal parts (extending from left to right) and vertical parts (extending up and down). The horizontal parts are offset from each other in the vertical direction, and are interconnected to each other by the vertical parts at respective ends of the horizontal parts. Shape (e.g., bentness) of the diffusing barrier pattern 300 along the horizontal direction may be regular (e.g., periodic) or irregular (e.g., aperiodic).

Second Embodiment

FIGS. 6 to 11 are cross-sectional views enlarging parts of light source units according to a second embodiment of the present disclosure.

Referring to FIGS. 6 to 11, in the glass PCB (220 of FIG. 2), the third and fourth line patterns 225*a* and 225*b* may be located on the first insulating layer 227*a* on the substrate (221 of FIG. 2). The second insulating layer 227*b* may be located on the third and fourth line patterns 225*a* and 225*b*. The second insulating layer 227*b* may include the second and third contact holes 228*b* and 228*c* respectively exposing the first and second soldering pads 229*a* and 229*b*, and the third and fourth line patterns 225*a* and 225*b* may respectively include the first and second soldering pads 229*a* and 229*b* located at ends of the third and fourth line patterns 225*a* and 225*b* facing each other.

The first and second soldering pads 229*a* and 229*b* exposed through the second and third contact holes 228*b* and 228 and the LED 210 may be soldered to each other using the solder resist 213, and the LED 210 may be mounted on the glass PCB (220 of FIG. 2).

The solder resist 213 may be formed of a tin (Sn) based material. More particularly, the solder resist 213 may include tin (Sn) as a main component and further silver (Ag) and/or copper (Cu).

Figure 6:
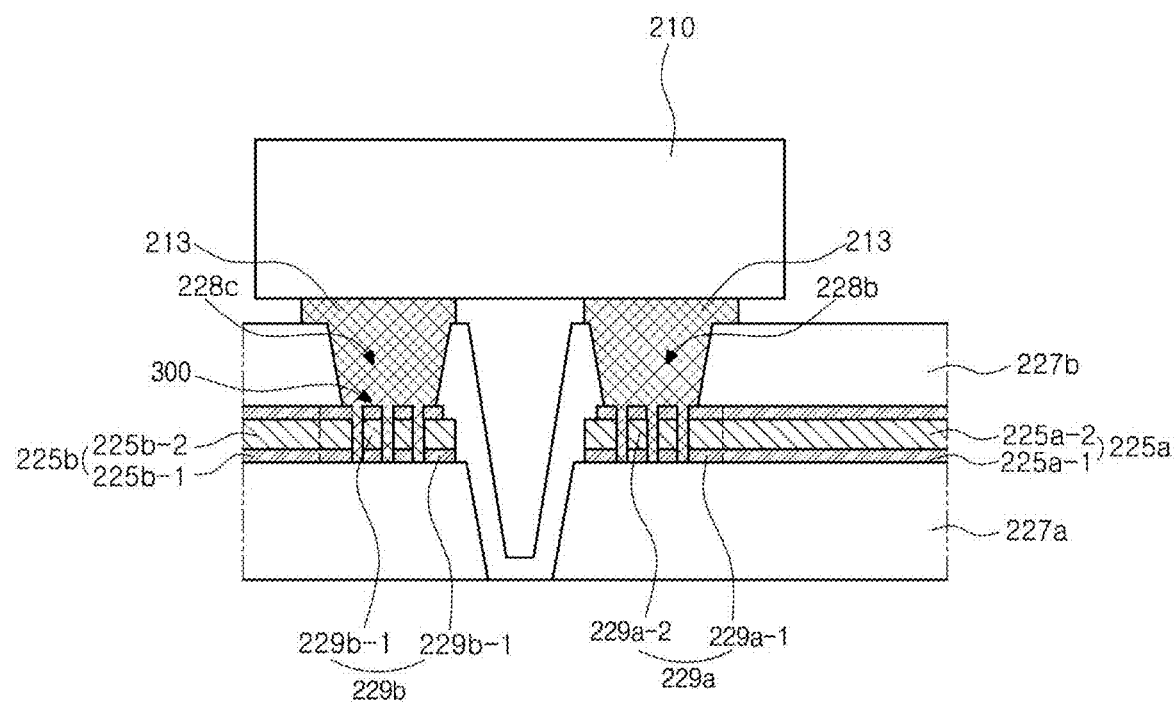
FIGS. 6 to 11 are cross-sectional views enlarging parts of light source units according to a second embodiment of the present disclosure.

In the display device 100 according to the second embodiment of the present disclosure, as shown in FIG. 6, the first and second soldering pads 229*a* and 229*b* may have triple-layered structures of molybdenum-titanium (MoTi) alloy layers 229*a*-1 and 229*b*-1 and copper (Cu) layers 229*a*-2 and 229*b*-2 and further diffusing barrier patterns 300 located thereon, and the molybdenum-titanium (MoTi) alloy layers 229*a*-1 and 229*b*-1 and the copper (Cu) layers 229*a*-2 and 229*b*-2 may be patterned simultaneously along with the diffusing barrier patterns 300 to expose the second insulating layer 227*b* therebelow.

In other words, the molybdenum-titanium (MoTi) alloy layers 229*a*-1 and 229*b*-1, the copper (Cu) layers 229*a*-2 and 229*b*-2 and the diffusing barrier patterns 300 may all have a lattice shape.

In the case that the molybdenum-titanium (MoTi) alloy layers 229*a*-1 and 229*b*-1, the copper (Cu) layers 229*a*-2 and 229*b*-2 along with the diffusing barrier patterns 300 are configured to expose the second insulating layer 227*b*, a contact area of the soldering pads 229*a* and 229*b* and the solder resist 213 can be maximized or increased, and the soldering pads 229*a* and 229*b* and the solder resist 213 can be fixed more firmly.

Figure 7:
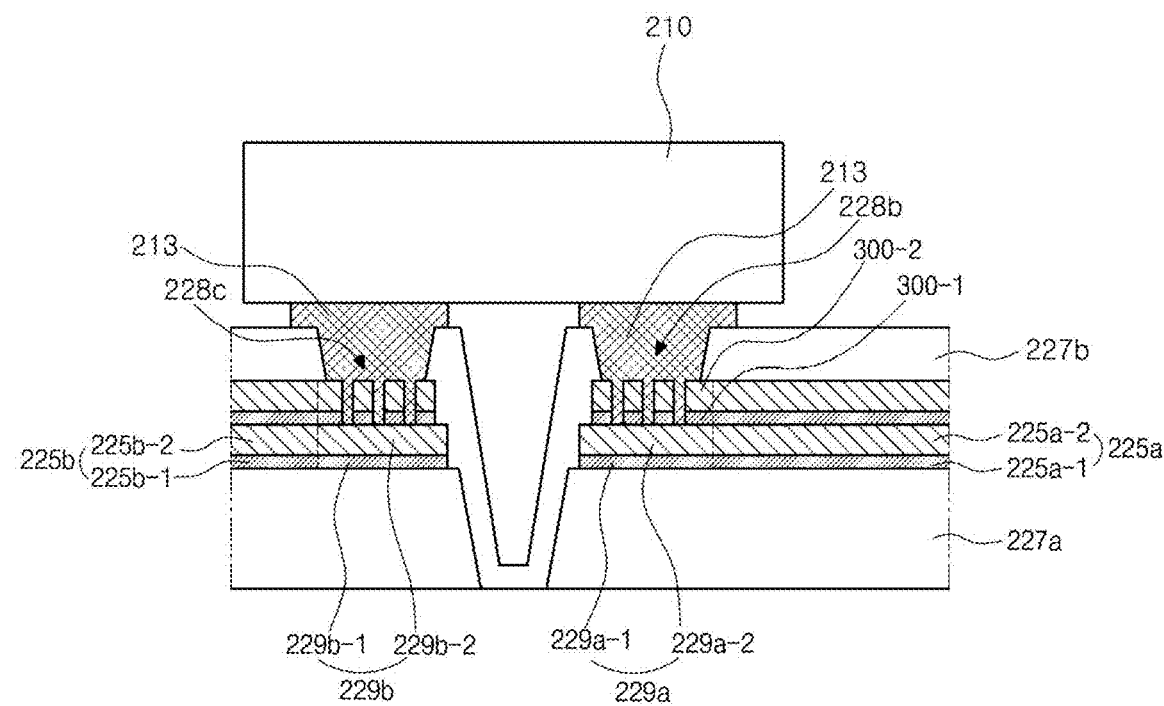

Alternatively, as shown in FIG. 7, the third and fourth line patterns 225*a* and 225*b* may have double-layered structures of molybdenum-titanium (MoTi) alloy layers 225*a*-1 and 225*b*-1 and copper (Cu) layers 225*a*-2 and 225*b*-2 being stacked. The first and second soldering pads 229*a* and 229*b* may have first diffusing barrier patterns 300-1 and second diffusing barrier patterns 300-2 which are located on double layers of molybdenum-titanium (MoTi) alloy layers 229*a*-1 and 229*b*-1 and copper (Cu) layers 229*a*-2 and 229*b*-2.

The first diffusing barrier pattern 300-1 may be formed of molybdenum-titanium (MoTi) alloy, and the second diffusing barrier pattern 300-2 may be formed of copper (Cu). The first and second diffusing barrier patterns 300-1 and 300-2 may be simultaneously patterned to expose the copper (Cu) layers 225*a*-2 and 225*b*-2 of the third and fourth line patterns 225*a* and 225*b*.

Figure 8:
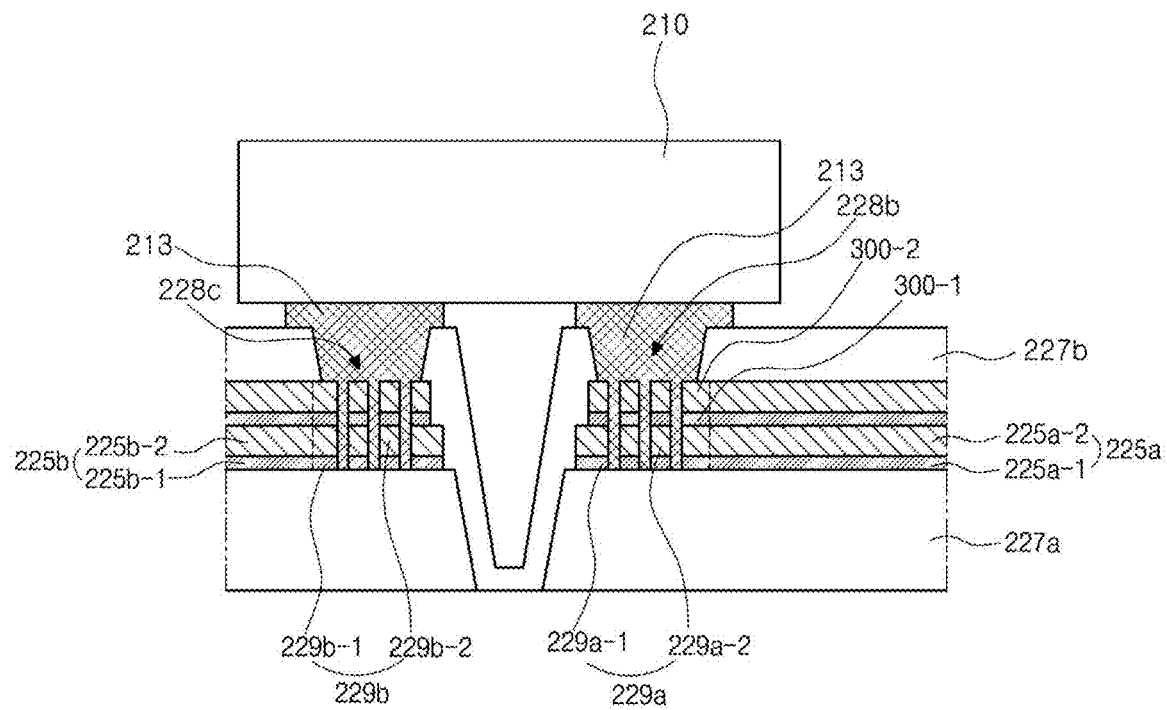

As shown in FIG. 8, the molybdenum-titanium (MoTi) alloy layers 229*a*-1 and 229*b*-1 and the copper (Cu) layers 229*a*-2 and 229*b*-2 may also be patterned simultaneously with the first and second diffusing barrier patterns 300-1 and 300-2 to expose the first insulating layer 227*a*.

Accordingly, the IMC being formed between the soldering pads 229*a* and 229*b* and the solder resists 213 can be suppressed, and an occurrence of the Kirkendall voids can be reduced. Thus, the soldering pads 229*a* and 229*b* and the solder resists 213 can have an excellent electrical contact property and a high reliability, and a contact area between the soldering pads 229*a* and 229*b* and the solder resists 213 can be maximized or increased.

In this regard, a contact area between the soldering pads 229*a* and 229*b* and the solder resists 213 can be maximized or increased by the second diffusing barrier pattern 300-2 formed of copper (Cu), and thus the soldering pads 229*a* and 229*b* and the solder resist 213 can be fixed more firmly.

In other words, the solder resists 213 may firstly contact and be adhered to the copper (Cu) layers 225*a*-2 and 225*b*-2 of the third and fourth line patterns 225*a* and 225*b* exposed by the first and second diffusing barrier patterns 300-1 and 300-2 and may secondly contact and be adhered to side surfaces of the first and second diffusing barrier patterns 300-1 and 300-2. Thus, a contact area between the soldering pads 229*a* and 229*b* and the solder resists 213 can be maximized or increased.

Thus, the soldering pads 229*a* and 229*b* and the solder resist 213 can be fixed more firmly, and even though the soldering pads 229*a* and 229*b* include the copper (Cu) layers 229*a*-2 and 229*b*-2, a detachment of the LED 210 mounted on the glass PCB (220 of FIG. 2) can be prevented.

Figure 9:
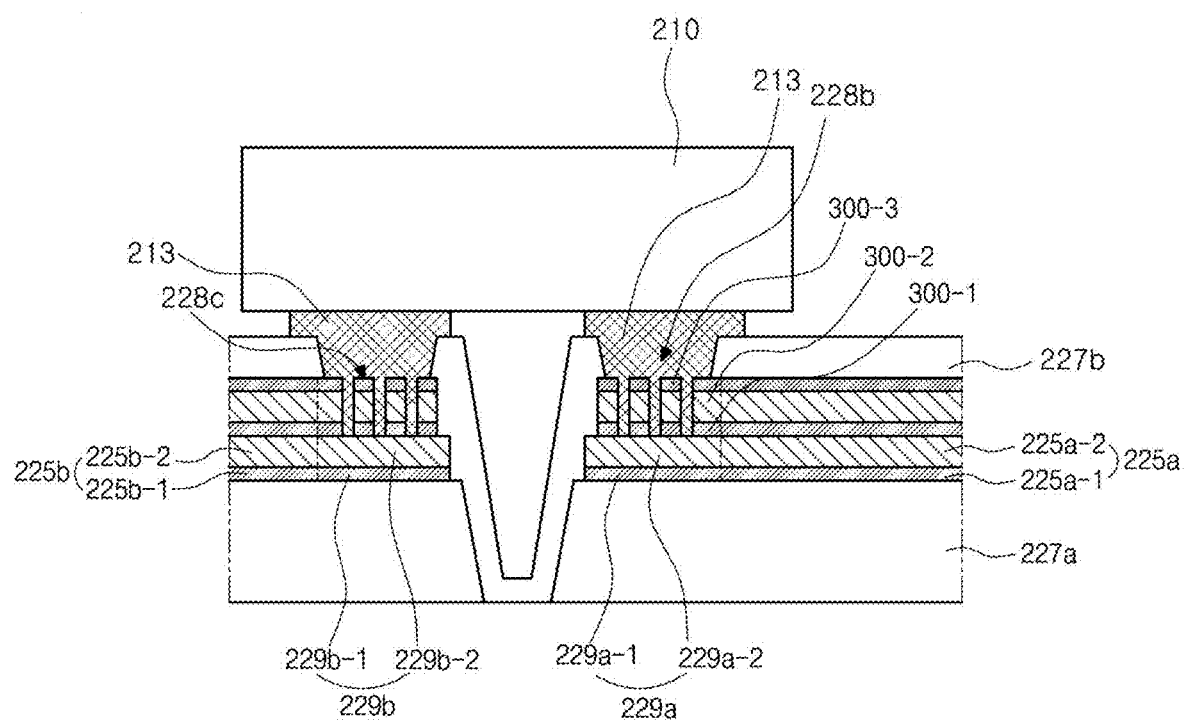

Alternatively, further to the configuration of FIG. 7 of the first and second barrier patterns 300-1 and 300-2 being simultaneously patterned to expose the copper (Cu) layers 225*a*-2 and 225*b*-2 of the third and fourth line patterns 225*a* and 225b, a third diffusing barrier pattern 300-3 may be formed on the first and second barrier patterns 300-1 and 300-2, as shown in FIG. 9. The third diffusing barrier pattern 300-3 may be formed of molybdenum-titanium (MoTi) alloy.

By forming the third diffusing barrier pattern 300-3 of molybdenum-titanium (MoTi) on the second diffusing barrier pattern 300-2 of copper (Cu), the IMC being formed even between the second diffusing barrier pattern 300-2 and the solder resist 213 can be suppressed, and an occurrence of the Kirkendall voids at this region can be reduced.

Figure 10:
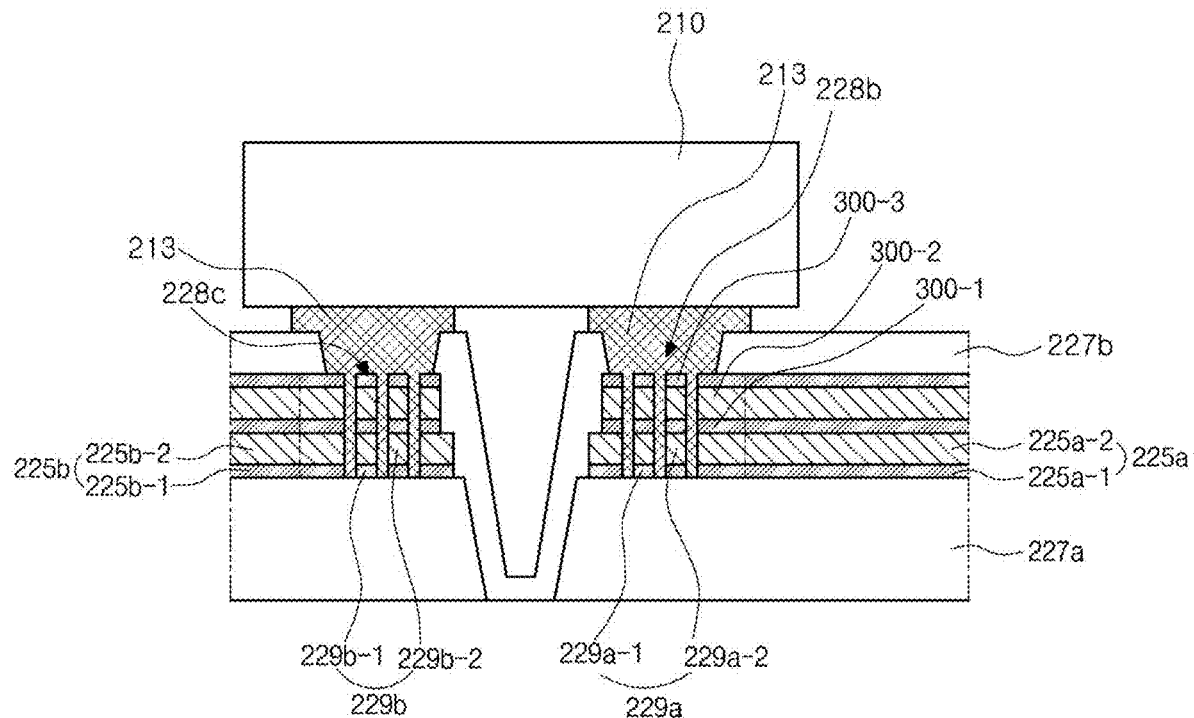

Alternatively, as shown in FIG. 10, the molybdenum-titanium (MoTi) alloy layers 229a-1 and 229b-1 and the copper (Cu) layers 229a-2 and 229b-2 may also be patterned simultaneously with the first to third diffusing barrier patterns 300-1, 300-2 and 300-3 to expose the first insulating layer 227a.

Figure 11:
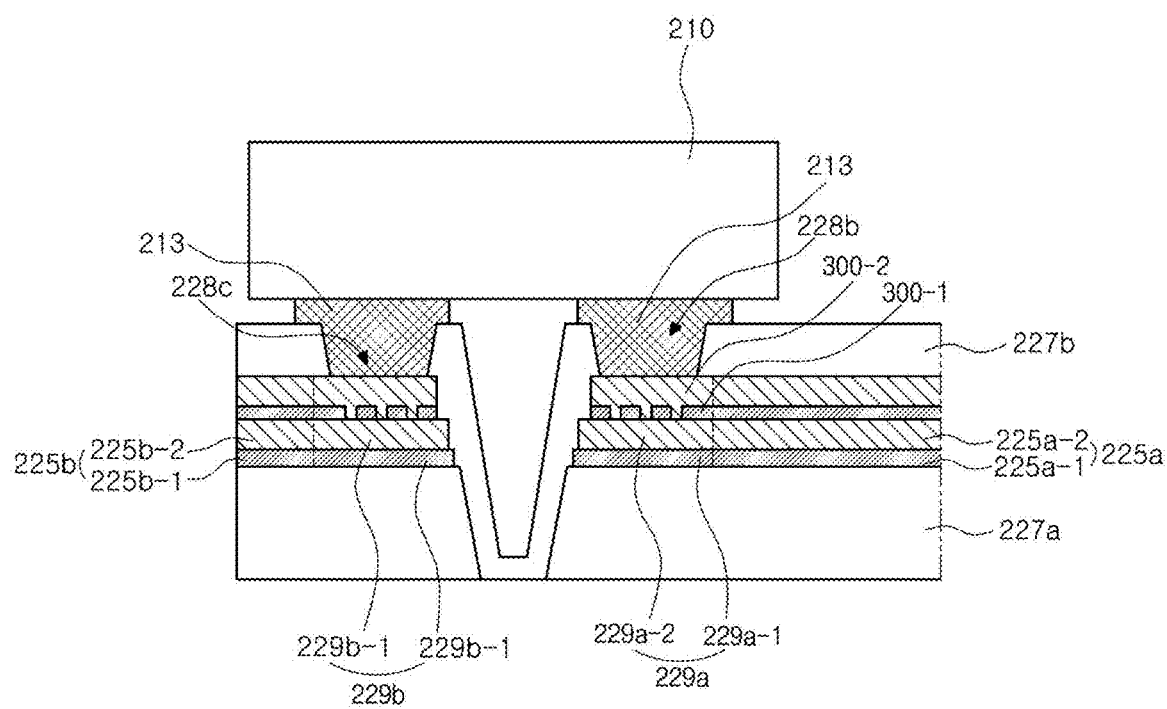

Alternatively, as shown in FIG. 11, the third and fourth line patterns 225a and 225b may have double-layered structures of molybdenum-titanium (MoTi) alloy layers 225a-1 and 225b-1 and copper (Cu) layers 225a-2 and 225b-2 being stacked. The first and second soldering pads 229a and 229b may have first diffusing barrier patterns 300-1 and second diffusing barrier patterns 300-2 which are located on double layers of molybdenum-titanium (MoTi) alloy layers 229a-1 and 229b-1 and copper (Cu) layers 229a-2 and 229b-2. In this case, while the first diffusing barrier patterns 300-1 may be patterned, the second diffusing barrier patterns 300-2 may not be patterned.

In the case that the second diffusing barrier patterns 300-2 are not patterned, the second diffusing barrier patterns 300-2 are completely adhered to the copper (Cu) layers 229a-2 and 229b-2 of the soldering pads 229a and 229b exposed through the patterned first diffusing barrier pattern 300-1, and an adhesion force between the glass PCB (220 of FIG. 2) and the soldering pads 229a and 229b can be further improved.

Further, by the second diffusing barrier patterns 300-2 not patterned and the copper (Cu) layers 229a-2 and 229b-2 of the soldering pads 229a and 229b, a thickness of the copper (Cu) layers can be secured, and a voltage drop phenomenon caused by a thin thickness of the copper (Cu) layers can be prevented. As described above, in the display devices (100 of FIG. 1) according to the first and second embodiments of the present disclosure, the PCB of the light source unit (200 of FIG. 2) may be formed of the glass PCB (220 of FIG. 2). Thus, compared with the prior art circuit board using a substrate formed of a synthetic resin or an insulating material, a thermal conductivity can be improved, and a flatness can be very improved.

Accordingly, a heat of high temperature produced from the LED 210 can rapidly dissipate to the outside, and a malfunction of the LED 210 or a reduction of lifetime of the LED 210 can be prevented. Further, a bad bonding of the fine patterns 225a and 225b formed on the glass PCB can be prevented.

Finally, a production cost of the glass PCB can be reduced, and an efficiency of a manufacturing process of the glass PCB can be improved.

Particularly, in the display devices according to the first and second embodiments of the present disclosure, because the diffusing barrier patterns 300-1 and 300-2 may be formed on the soldering pads 229a and 229b formed at the glass PCB of the light source unit, the IMC being formed between the soldering pads 229a and 229b and the solder resists 213 can be prevented. Thus, the LED 210 can be stably mounted on the glass PCB, and problems caused by a detachment of the LED 210 can be prevented.

Third Embodiment

Figure 12:
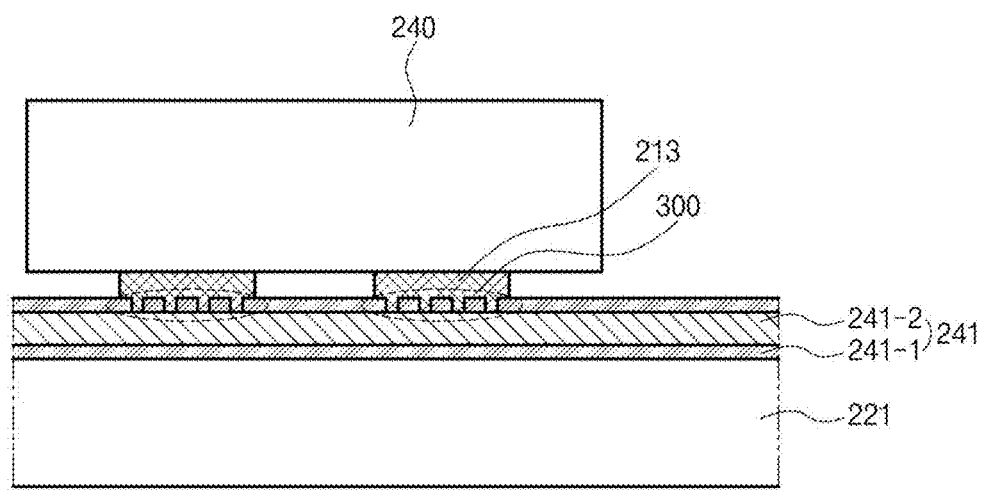
FIG. 12 is a cross-sectional view enlarging a part of a light source unit according to a third embodiment of the present disclosure.

FIG. 12 is a cross-sectional view enlarging a part of a light source unit according to a third embodiment of the present disclosure.

Referring to FIG. 12, an external contact pad 241 may be formed at the glass PCB 220 of the non-display region (NA of FIG. 2) and may extend from the second line layer 225. The connector 240 may be soldered to the external contact pad 241 through the solder resist 213.

The connector 240 may be electrically connected to an external driving circuit (not shown).

The solder resist 213 may be formed of a tin (Sn) based material. More particularly, the solder resist 213 may include tin (Sn) as a main component and further silver (Ag) and/or copper (Cu).

In the display device (100 of FIG. 1) according to the third embodiment of the present disclosure, the external contact pad241 may have a double-layered structure of a molybdenum-titanium (MoTi) alloy layer 241-1 and a copper (Cu) layer 241-2 being stacked, and a diffusing barrier pattern 300 may be further located on the copper (Cu) layer 241-2.

The diffusing barrier pattern 300 may be formed of molybdenum-titanium (MoTi)alloy, and be patterned to expose the copper (Cu) layer 241-2 therebelow.

Accordingly, in the display device according to the third embodiment of the present disclosure, the IMC being formed between the external contact pad 241 and the solder resist 213 can be suppressed by the diffusing barrier pattern 300, and an occurrence of the Kirkendall voids can be reduced.

Accordingly, the external contact pad 241 and the solder resist 213 can have an excellent electrical contact property and a high reliability. Thus, in the display device according to the third embodiment of the present disclosure, even though the external contact pad 241 includes the copper (Cu) layer 241-2, a detachment of the connector 240 mounted on the glass PCB 220 can be prevented.

As described above, in the display devices (100 of FIG. 1) according to the first and second embodiments of the present disclosure, the PCB of the light source unit (200 of FIG. 2) may be formed of the glass PCB 220. Thus, with the prior art circuit board using a substrate of a synthetic resin or an insulating material, a thermal conductivity can be improved compared, and a flatness can be very improved.

Particularly, in the display devices according to the third embodiment of the present disclosure, because the diffusing barrier pattern 300 may be formed on the external contact pad 241formed at the glass PCB 220 of the light source unit, the IMC being formed between the external contact pad 241 and the solder resist 213 can be prevented. Thus, the connector 240 can be stably mounted on the glass PCB 220, and problems caused by a detachment of the connector 240 can be prevented.

As described in the above embodiments, the light source unit of the display device may include a plurality of LEDs mounted on the glass PCB. Thus, compared with the prior art circuit board using a substrate formed of a synthetic resin or an insulating material, a thermal conductivity can be improved and a flatness can be very improved.

Accordingly, a heat of high temperature produced from the LED can rapidly dissipate to the outside, and a malfunction of the LED or a reduction of lifetime of the LED can be prevented. Further, a bad bonding of the fine patterns formed on the glass PCB can be prevented.

Finally, a production cost of the glass PCB can be reduced, and an efficiency of a manufacturing process of the glass PCB can be improved.

Particularly, because the diffusing barrier pattern may be formed on the soldering pad formed at the glass PCB, the IMC being formed between the soldering pad and the solder resist can be prevented. Thus, the LED can be stably mounted on the glass PCB, and problems caused by a detachment of the LED can be prevented.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A light source unit for a display device, the light source unit comprising:
   a printed circuit board including:
      a soldering pad located on a substrate and including a copper layer; and
      a first diffusing barrier pattern located on the soldering pad and including a molybdenum alloy; and
   a light emitting diode mounted on the soldering pad through a solder resist.

2. The light source unit of claim 1, wherein the first diffusing barrier pattern is made of a molybdenum-titanium alloy.

3. The light source unit of claim 1, wherein the first diffusing barrier pattern has a lattice shape and exposes the copper layer of the soldering pad.

4. The light source unit of claim 1, wherein the first diffusing barrier pattern includes a plurality of bar-shaped portions spaced apart from each other.

5. The light source unit of claim 4, wherein the bar-shaped portion has a plurality of bent parts.

6. The light source unit of claim 1, further comprising a second diffusing barrier pattern which is located on the first diffusing barrier pattern and is made of copper.

7. The light source unit of claim 6, further comprising a third diffusing barrier pattern which is located on the second diffusing barrier pattern and is made of a molybdenum-titanium alloy.

8. The light source unit of claim 6, wherein the first diffusing barrier pattern and the second diffusing barrier pattern expose the copper layer of the soldering pad.

9. The light source unit of claim 6, wherein the soldering pad, the first diffusing barrier pattern and the second diffusing barrier pattern expose an insulating layer located below the soldering pad.

10. The light source unit of claim 1, wherein the soldering pad and the first diffusing barrier pattern expose an insulating layer located below the soldering pad.

11. The light source unit of claim 1, wherein the soldering pad further includes a molybdenum-titanium alloy layer below the copper layer.

12. The light source unit of claim 1, wherein another diffusing barrier pattern is located on an external contact pad and includes a molybdenum alloy, the external contact pad including a copper layer at a side of the printed circuit board, and wherein a connector is mounted on the external contact pad through another solder resist.

13. The light source unit of claim 1, wherein the printed circuit board is comprised of glass.

14. The light source unit of claim 13, wherein the glass for the printed circuit board is a fully transparent glass.

15. The light source unit of claim 1, wherein the substrate is comprised of glass.

16. A display device, comprising:
   a light source unit including:
      a printed circuit board; and
      a plurality of light emitting diodes mounted on the printed circuit board;
   an optical unit located on the light source unit; and
   a display panel located on the optical unit,
      wherein the printed circuit board includes a soldering pad, and a first diffusing barrier pattern, and
      wherein a light emitting diode is mounted on the soldering pad through a solder resist.

17. The display device of claim 16, wherein the soldering pad includes a copper layer, and the first diffusing barrier pattern is made of a molybdenum-titanium alloy.

18. The display device of claim 17, wherein the first diffusing barrier pattern has a lattice shape and exposes the copper layer of the soldering pad.

19. The display device of claim 16, wherein a second diffusing barrier pattern is located on the first diffusing barrier pattern and is made of copper.

20. The display device of claim 19, wherein a third diffusing barrier pattern is located on the second diffusing barrier pattern and is made of a molybdenum-titanium alloy.

21. The display device of claim 19, wherein an optical gap or an air gap is provided between the light source unit and the optical unit.

* * * * *